(12) United States Patent
Jeong

(10) Patent No.: US 9,704,589 B1
(45) Date of Patent: Jul. 11, 2017

(54) FOLDING CIRCUIT AND NONVOLATILE MEMORY DEVICES

(71) Applicant: SK hynix Inc., Icheon-si, Gyeonggi-do (KR)

(72) Inventor: Hoe Sam Jeong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/230,952

(22) Filed: Aug. 8, 2016

(30) Foreign Application Priority Data

Apr. 19, 2016 (KR) ................ 10-2016-0047773

(51) Int. Cl.
*G11C 16/26* (2006.01)
*G11C 16/04* (2006.01)

(52) U.S. Cl.
CPC .......... *G11C 16/26* (2013.01); *G11C 16/0408* (2013.01)

(58) Field of Classification Search
None
See application file for complete search history.

(56) References Cited

U.S. PATENT DOCUMENTS

| 2008/0080247 A1* | 4/2008 | Chang .................. G11C 16/12 365/185.18 |
| 2009/0279344 A1* | 11/2009 | Toda .................... G11C 8/08 365/148 |
| 2014/0355353 A1* | 12/2014 | Tsai ..................... G11C 16/06 365/185.21 |
| 2015/0279473 A1 | 10/2015 | Yoo et al. |

* cited by examiner

*Primary Examiner* — J. H. Hur
(74) *Attorney, Agent, or Firm* — William Park & Associates Ltd.

(57) ABSTRACT

A nonvolatile memory device includes a nonvolatile memory cell coupled to a bit line. The nonvolatile memory device may include a sensing circuit configured to output a sensing output signal for sensing a status of the nonvolatile memory cell based on a sensing input signal inputted to the sensing circuit through a sensing input line. The nonvolatile memory device may include a folding circuit coupled to the bit line to output the sensing input signal having a voltage low level or a voltage high level according to a voltage level of the bit line.

15 Claims, 11 Drawing Sheets

FOLDING CIRCUIT AND NONVOLATILE MEMORY DEVICES

CROSS-REFERENCE TO RELATED APPLICATIONS

The present application claims priority under 35 U.S.C 119(a) to Korean Patent Application No. 10-2016-0047773, filed on Apr. 19, 2016, which is herein incorporated by reference in its entirety.

BACKGROUND

1. Technical Field

Various embodiments of the present disclosure may generally relate to nonvolatile memory devices and, more particularly, to nonvolatile memory devices relating to a wide operation range in a read mode and dully operating against variation of characteristics of transistors.

2. Related Art

Semiconductor memory devices are typically categorized as either random access memory (RAM) devices or read only memory (ROM) devices according to data volatility of the semiconductor memory devices. The RAM devices lose data stored within when the power supplies of the RAM devices are interrupted. In contrast, the ROM devices retain data stored within even when the power supplies of the ROM devices are interrupted. The ROM devices may also be classified as programmable ROM (PROM) devices or mask ROM devices according to data input methods, that is, data program methods. The PROM devices may be fabricated and sold out without program and may be directly programmed by customers (i.e., users) after fabrication of the PROM devices. The mask ROM devices may be programmed during fabrication thereof using implantation masks manufactured based on data requested by users. The PROM devices may include one-time PROM (OTPROM) devices, erasable PROM (EPROM) devices and electrically erasable PROM (EEPROM) devices. Once the OTPROM devices are programmed, the programmed data of the OTPROM devices cannot be changed.

N-MOS transistors or P-MOS transistors may be used as cell transistors of the nonvolatile memory devices, for example, the OTPROM devices. If P-MOS transistors are used as the cell transistors of the nonvolatile memory devices, the P-MOS cell transistors may have a turn-off status as an initial status of the P-MOS cell transistors and may have a turn-on status as a programmed status of the P-MOS cell transistors. A read operation of the P-MOS cell transistors may be executed by sensing a voltage level of a bit line connected to any one selected from the P-MOS cell transistors. In such a case, the voltage level of the bit line may be determined by a resistance ratio of an equivalent resistance of the selected P-MOS cell transistor to a resistance value of a load resistor coupled between a supply voltage line and the bit line.

SUMMARY

According to an embodiment, a nonvolatile memory device may be provided. The nonvolatile memory device may include a nonvolatile memory cell coupled to a bit line. The nonvolatile memory device may include a sensing circuit configured to output a sensing output signal for sensing a status of the nonvolatile memory cell based on a sensing input signal inputted to the sensing circuit through a sensing input line. The nonvolatile memory device may include a folding circuit coupled to the bit line to output the sensing input signal having a voltage low level or a voltage high level according to a voltage level of the bit line.

According to an embodiment, a nonvolatile memory device may be provided. The nonvolatile memory device may include a nonvolatile memory cell coupled to a bit line, a sensing circuit configured to output a sensing output signal for sensing a status of the nonvolatile memory cell based on a sensing input signal inputted to the sensing circuit through a sensing input line, and a folding circuit coupled to the nonvolatile memory cell through the bit line and coupled to the sensing circuit through the sensing input signal. The folding circuit prevents a read operation of nonvolatile memory cell, having a programmed status, from being affected by fluctuation characteristics of transistors within the folding circuit and the sensing circuit.

DETAILED DESCRIPTION

In the following description of the embodiments, it will be understood that the terms "first" and "second" are intended to identify an element, but not used to define only the element itself or to mean a particular sequence. In addition, when an element is referred to as being located "on", "over", "above", "under" or "beneath" another element, it is intended to mean relative position relationship, but not used to limit certain cases that the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element or elements therebetween.

Various embodiments may be directed to nonvolatile memory devices.

Figure 1:
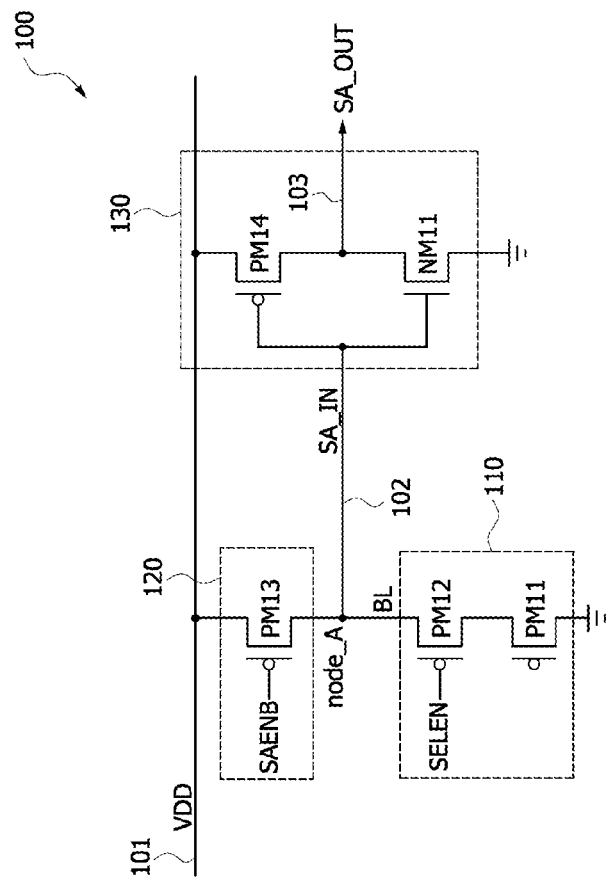
FIG. 1 is a circuit diagram illustrating a general nonvolatile memory device.

FIG. 1 is a circuit diagram illustrating a general nonvolatile memory (NVM) device 100. Referring to FIG. 1, the NVM device 100 consists of an NVM cell 110, a resistive load portion 120 and a sensing circuit 130. The NVM cell 110 consists of a first P-MOS transistor PM11 acting as a cell transistor and a second P-MOS transistor PM12 acting as a selection transistor. A gate of the first P-MOS transistor PM11 corresponds to a floating gate, and a drain of the first P-MOS transistor PM11 is coupled to a ground terminal. A source of the first P-MOS transistor PM11 is coupled to a drain of the second P-MOS transistor PM12. A selection enablement signal SELEN is applied to a gate of the second P-MOS transistor PM12. A source of the second P-MOS transistor PM12 is coupled to a first node node_A through a bit line BL.

The resistive load portion 120 consists of a resistive load coupled between a supply voltage line 101 and the first node node_A. The resistive load is realized using a third P-MOS transistor PM13. An enablement signal SAENB is applied to a gate of the third P-MOS transistor PM13. The enablement signal SAENB is an inverted (complementary) signal of a sense amplification enablement signal. A source and a drain of the third P-MOS transistor PM13 is coupled to the supply voltage line 101 and the first node node_A (i.e., the bit line BL), respectively. If the third P-MOS transistor PM13 is turned on, the third P-MOS transistor PM13 acts as a resistive element coupled between the supply voltage line 101 and the first node node_A.

The sensing circuit 130 is realized using a complementary metal-oxide-semiconductor (CMOS) inverter comprised of a first N-MOS transistor NM11 and a fourth P-MOS transistor PM14. A gate of the first N-MOS transistor NM11 and a gate of the fourth P-MOS transistor PM14 is coupled to the first node node_A through a sensing input line 102 that transmits a sensing input signal SA_IN. A source of the first N-MOS transistor NM11 is coupled to the ground terminal. A drain of the first N-MOS transistor NM11 is coupled to a drain of the fourth P-MOS transistor PM14. A source of the fourth P-MOS transistor PM14 is coupled to the supply voltage line 101 that transmits a supply voltage VDD. The drains of the first N-MOS transistor NM11 and the fourth P-MOS transistor PM14 are coupled to a sensing output line 103. The sensing circuit 130 outputs a sensing output signal SA_OUT through the sensing output line 103.

The first P-MOS transistor PM11 acting as a cell transistor of the NVM cell 110 has an initial status or a programmed status. The initial status means an off-cell status that the first P-MOS transistor PM11 is turned off, and the programmed status means an on-cell status that the first P-MOS transistor PM11 is turned on.

In order to read out the status of the first P-MOS transistor PM11, the selection enablement signal SELEN having a low level is applied to the gate of the second P-MOS transistor PM12 to turn on the second P-MOS transistor PM12. In addition, a level of the sense amplification enablement signal is changed from a low level into a high level. Accordingly, a level of the enablement signal SAENB is changed from a high level into a low level, and the enablement signal SAENB having a low level is applied to the gate of the third P-MOS transistor PM13 to turn on the third P-MOS transistor PM13. In such a case, if the supply voltage VDD is applied to the supply voltage line 101, a bit line voltage at the first node node_A may correspond to a voltage that remains after subtracting a voltage drop across the third P-MOS transistor PM13, which is turned on, from the supply voltage VDD. The bit line voltage corresponds to a voltage level of the sensing input signal SA_IN, and the sensing input signal SA_IN is applied to the sensing circuit 130 through the sensing input line 102.

If the first P-MOS transistor PM11 has an initial status corresponding to an off-cell status, an equivalent resistor between the first node node_A and the ground terminal ideally has an infinite resistance value. However, a substantial resistance value between the first node node_A and the ground terminal is not an infinite value. That is, the equivalent resistor between the first node node_A and the ground terminal has a high resistance value as compared with an equivalent resistance value of the third P-MOS transistor PM13 which is turned on. Thus, a signal of the first node node_A, that is, the sensing input signal SA_IN has a voltage which is equal to the supply voltage VDD. If the sensing input signal SA_IN having the supply voltage VDD is inputted to the sensing circuit 130, the fourth P-MOS transistor PM14 is not turned on while the first N-MOS transistor NM11 is turned on. Thus, a signal having a ground voltage is outputted as the sensing output signal SA_OUT. Accordingly, if a signal having the ground voltage is outputted as the sensing output signal SA_OUT, the first P-MOS transistor PM11 acting as a cell transistor is regarded as having an initial status.

If the first P-MOS transistor PM11 has a programmed status corresponding to an on-cell status, an equivalent resistor between the first node node_A and the ground terminal ideally has a resistance value of zero ohms. However, a substantial resistance value between the first node node_A and the ground terminal is not zero ohms. That is, the equivalent resistor between the first node node_A and the ground terminal has a low resistance value as compared with an equivalent resistance value of the third P-MOS transistor PM13 which is turned on. Thus, a signal of the first node node_A, that is, the sensing input signal SA_IN has a voltage which is equal to the ground voltage. If the sensing input signal SA_IN having the ground voltage is inputted to the sensing circuit 130, the first N-MOS transistor NM11 is not turned on while the fourth P-MOS transistor PM14 is turned on. Thus, a signal having the supply voltage VDD is outputted as the sensing output signal SA_OUT. Accordingly, if a signal having the supply voltage VDD is outputted as the sensing output signal SA_OUT, the first P-MOS transistor PM11 acting as a cell transistor is regarded as having a programmed status.

In the read operation described above, if the first P-MOS transistor PM11 acting as a cell transistor has an initial status, the first node node_A has a voltage close to the supply voltage VDD. That is, the bit line BL has a bit line voltage close to the supply voltage VDD. While the read operation of the first P-MOS transistor PM11 is executed, the bit line voltage close to the supply voltage VDD is continuously applied to the first P-MOS transistor PM11 to electrically stress the first P-MOS transistor PM11. In particular, if the supply voltage VDD increases, characteristics of the first P-MOS transistor PM11 is easily changed by the electrical stress which is due to the bit line voltage. As a result, a leakage current may flow from the first node node_A toward the ground terminal through the first P-MOS transistor PM11 to cause a read disturbance phenomenon.

Figure 2:
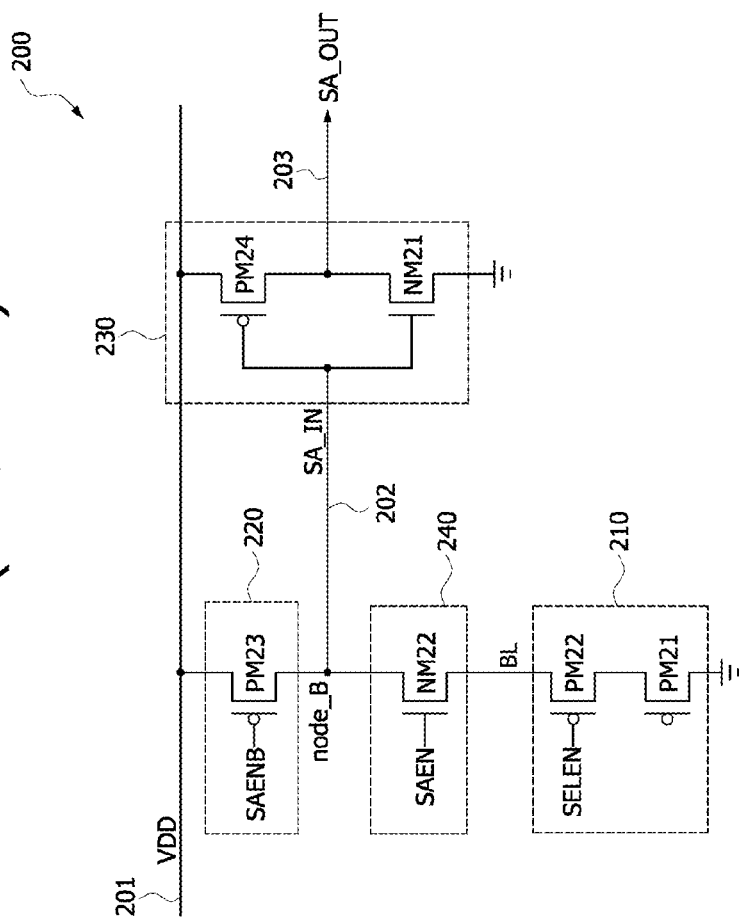
FIG. 2 is a circuit diagram illustrating another general nonvolatile memory device

FIG. 2 is a circuit diagram illustrating another general NVM device 200. Referring to FIG. 2, the NVM device 200 consists of an NVM cell 210, a resistive load portion 220, a sensing circuit 230 and a read disturbance suppressor 240. The NVM cell 210 consists of a first P-MOS transistor PM21 acting as a cell transistor and a second P-MOS transistor PM22 acting as a selection transistor. A gate of the first P-MOS transistor PM21 corresponds to a floating gate, and a drain of the first P-MOS transistor PM21 is coupled to a ground terminal. A source of the first P-MOS transistor PM21 is coupled to a drain of the second P-MOS transistor PM22. A selection enablement signal SELEN is applied to a gate of the second P-MOS transistor PM22. A source of the second P-MOS transistor PM22 is coupled to a bit line BL.

The resistive load portion 220 consists of a resistive load coupled between a supply voltage line 201 and a first node node_B. The resistive load is realized using a third P-MOS transistor PM23. An enablement signal SAENB is applied to a gate of the third P-MOS transistor PM23. The enablement signal SAENB is an inverted (complementary) signal of a sense amplification enablement signal SAEN. A source and a drain of the third P-MOS transistor PM23 is coupled to the supply voltage line 201 and the first node node_B, respectively. If the third P-MOS transistor PM23 is turned on, the third P-MOS transistor PM23 acts as a resistive element coupled between the supply voltage line 201 and the first node node_B.

The sensing circuit 230 is realized using a complementary metal-oxide-semiconductor (CMOS) inverter consisting of a first N-MOS transistor NM21 and a fourth P-MOS transistor PM24. A gate of the first N-MOS transistor NM21 and a gate of the fourth P-MOS transistor PM24 is coupled to the first node node_B through a sensing input line 202 that transmits a sensing input signal SA_IN. The sensing input line 202 is not coupled to the bit line BL but the first node node_B. A source of the first N-MOS transistor NM21 is coupled to the ground terminal. A drain of the first N-MOS transistor NM21 is coupled to a drain of the fourth P-MOS transistor PM24. A source of the fourth P-MOS transistor PM24 is coupled to the supply voltage line 201 that transmits a supply voltage VDD. The drains of the first N-MOS transistor NM21 and the fourth P-MOS transistor PM24 are coupled to a sensing output line 203. The sensing circuit 230 may output a sensing output signal SA_OUT through the sensing output line 203.

The read disturbance suppressor 240 is realized using a second N-MOS transistor NM22. The sense amplification enablement signal SAEN is applied to a gate of the second N-MOS transistor NM22. A drain and a source of the second N-MOS transistor NM22 is coupled to the first node noce_B and the bit line BL, respectively. Accordingly, the sensing input line 202 and the bit line BL branch from the first node node_B to be separated from each other, and the second N-MOS transistor NM22 is coupled between the first node node_B and the bit line BL.

In order to read out the status of the first P-MOS transistor PM21 acting as a cell transistor, a level of the sense amplification enablement signal SAEN is changed from a low level into a high level, and the enablement signal SAENB corresponding to an inverted signal of the sense amplification enablement signal SAEN has a low level. If the enablement signal SAENB having a low level is applied to the gate of the third P-MOS transistor PM23 and the sense amplification enablement signal SAEN having a high level is applied to the gate of the second N-MOS transistor NM22, both of the third P-MOS transistor PM23 and the second N-MOS transistor NM22 are turned on. Accordingly, a voltage of the first node node_B corresponds to a voltage that remains after subtracting a voltage drop across the third P-MOS transistor PM23, which is turned on, from the supply voltage VDD. Thus, the sensing input signal SA_IN has a voltage level which is equal to the voltage of the first node node_B. In such a case, an operation of the sensing circuit 230 is the same as the operation of the sensing circuit 130 described with reference to FIG. 1.

In the case of the NVM device 200, a voltage of the bit line BL corresponds to a voltage that remains after subtracting a threshold voltage of the second N-MOS transistor NM22 from the voltage of the first node node_B. That is, since the second N-MOS transistor NM22 is disposed to be coupled between the first node node_B (coupled to the sensing input line 202) and the bit line BL, a voltage of the bit line BL is lowered by a threshold voltage of the second N-MOS transistor NM22 from a voltage of the first node node_B. Thus, during the read operation, it is possible to suppress a read disturbance phenomenon that occurs due to variation of characteristics of the first P-MOS transistor PM21 having an initial status, which is electrically stressed or damaged by a voltage of the bit line BL. However, in such a case, a voltage induced at the first node node_B is higher than a voltage induced at the first node node_A of FIG. 1 because of a voltage drop across the second N-MOS transistor NM22 coupled between the first node node_B and the bit line BL. Thus, if the first P-MOS transistor PM21 has a programmed status and the supply voltage VDD becomes lowered, it is difficult to turn on the fourth P-MOS transistor PM24 of the sensing circuit 230. This leads to reduction of a read margin at a low level of the supply voltage VDD.

In addition, threshold voltages of the second P-MOS transistor PM22 acting as a selection transistor, the fourth P-MOS transistor PM24 acting as a pull-up transistor of the sensing circuit 230, and the first N-MOS transistor NM21 acting as a pull-down transistor of the sensing circuit 230 vary according to temperature. If the temperature falls down, an absolute value of threshold voltage of the second P-MOS transistor PM22 increases to reduce a read margin of the NVM cell 210 at a low level of the supply voltage VDD. Moreover, if the threshold voltages of the fourth P-MOS transistor PM24 and the first N-MOS transistor NM21 change according to variation of the temperature, the read margin of the NVM cell 210 is also reduced. Furthermore, the threshold voltages of the transistors constituting the NVM device 200 is also changed by non-uniformity of a fabrication process of the NVM device 200.

Figure 3:
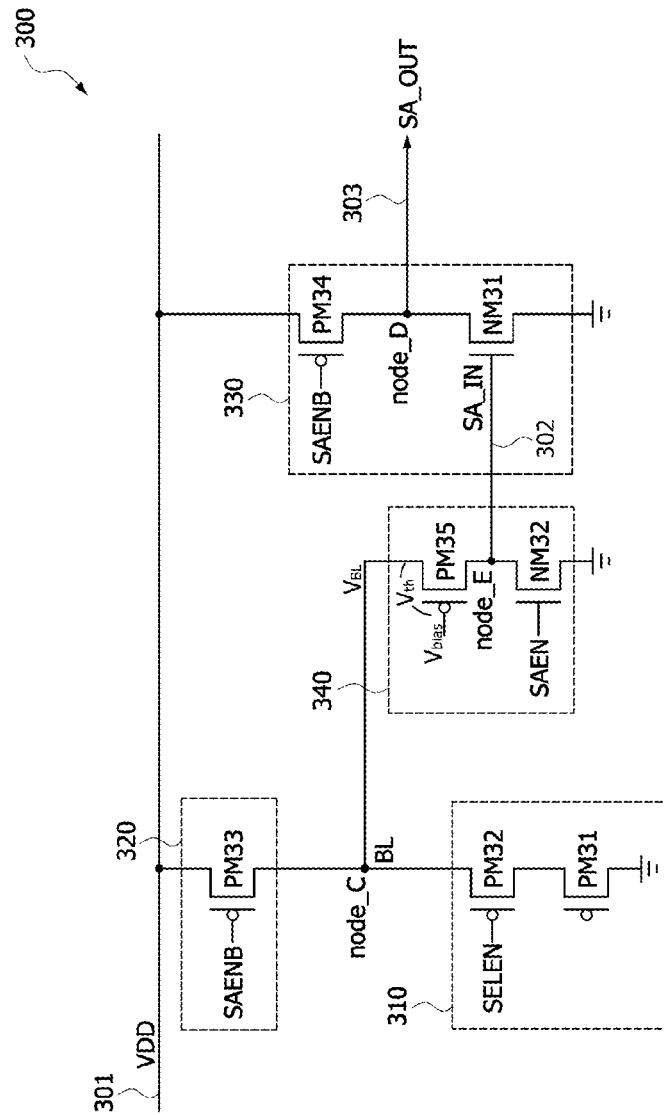
FIG. 3 is a circuit diagram illustrating a representation of an example of a nonvolatile memory device according to an embodiment of the present disclosure.

FIG. 3 is a circuit diagram illustrating a representation of an example of an NVM device 300 according to an embodiment of the present disclosure. Referring to FIG. 3, the NVM device 300 may be configured to include an NVM cell 310, a resistive load portion 320, a sensing circuit 330 and a folding circuit 340. The NVM cell 310 may be configured to include a selection transistor and a cell transistor which are coupled in series between a bit line BL and a ground voltage terminal. The cell transistor may be realized using a first P-MOS transistor PM31, and the selection transistor may be realized using a second P-MOS transistor PM32. The first P-MOS transistor PM31 may have a gate corresponding to a floating gate. A source and a drain of the first P-MOS transistor PM31 may be coupled to a drain of the second P-MOS transistor PM32 and the ground voltage terminal, respectively. The second P-MOS transistor PM32 may have a gate to which a selection enablement signal SELEN is inputted. A source of the second P-MOS transistor PM32 may be coupled to a first node node_C through a bit line BL. The first P-MOS transistor PM31 acting as a cell transistor may have an initial status or a programmed status. In some embodiments, the initial status means an off-cell status that the first P-MOS transistor PM31 is turned off, and the programmed status means an on-cell status that the first P-MOS transistor PM31 is turned on. However, these statuses are merely examples of some embodiments of the present disclosure. For example, in some other embodiments, the initial status means an on-cell status that the first P-MOS transistor PM31 is turned on, and the programmed status means an off-cell status that the first P-MOS transistor PM31 is turned off.

The resistive load portion 320 may be coupled between a supply voltage line 301 transmitting a supply voltage VDD and the first node node_C. The resistive load portion 320 may be realized using a third P-MOS transistor PM33. The third P-MOS transistor PM33 may have a gate to which an enablement signal SAENB is inputted. In some embodiments, the enablement signal SAENB may be an inverted (complementary) signal of a sense amplification enablement signal SAEN. A source and a drain of the third P-MOS transistor PM33 may be coupled to the supply voltage line 301 and the first node node_C (i.e., the bit line BL), respectively. If the third P-MOS transistor PM33 is turned on, the third P-MOS transistor PM33 may act as a resistive load coupled between the supply voltage line 301 and the first node node_C.

The sensing circuit 330 may output a sensing output signal SA_OUT for sensing a status of the first P-MOS transistor PM31 through a sensing output line 303 in response to a sensing input signal SA_IN which is inputted to the sensing circuit 330 through a sensing input line 302. The sensing circuit 330 may be configured to include a fourth P-MOS transistor PM34 and a first N-MOS transistor NM31 which are coupled in series between the supply voltage line 301 and the ground voltage terminal.

The enablement signal SAENB may be inputted to a gate of the fourth P-MOS transistor PM34. That is, the enablement signal SAENB may be inputted to both of the gate of the third P-MOS transistor PM33 constituting the resistive load portion 320 and the gate of the fourth P-MOS transistor PM34 constituting a pull-up transistor of the sensing circuit 330. A source and a drain of the fourth P-MOS transistor PM34 may be coupled to the supply voltage line 301 and a second node node_D, respectively. The second node node_D may be coupled to the sensing output line 303. A gate of the first N-MOS transistor NM31 may be coupled to the sensing input line 302. Thus, the sensing input signal SA_IN may be inputted to the gate of the gate of the first N-MOS transistor NM31. A drain and a source of the first N-MOS transistor NM31 may be coupled to the second node node_D and the ground terminal, respectively.

A transconductance (Gm) of the first N-MOS transistor NM31 may be greater than a transconductance of the fourth P-MOS transistor PM34. That is, a channel length of the first N-MOS transistor NM31 may be less than a channel length of the fourth P-MOS transistor PM34, or a channel width of the first N-MOS transistor NM31 may be greater than a channel width of the fourth P-MOS transistor PM34. This means that an equivalent resistance value of the first N-MOS transistor NM31 is less than that of the fourth P-MOS transistor PM34 if both of the first N-MOS transistor NM31 and the fourth P-MOS transistor PM34 are turned on. Thus, if both of the first N-MOS transistor NM31 and the fourth P-MOS transistor PM34 are turned on, the sensing output signal SA_OUT may have a low level.

The folding circuit 340 may be coupled between the bit line BL and the ground voltage terminal to output a voltage having a voltage low level or a voltage high level as the sensing input signal SA_IN through the sensing input line 302, according to the bit line voltage VBL. The sensing input signal SA_IN having the voltage low level may be the ground voltage. The sensing input signal SA_IN having the voltage high level may be a voltage close to the bit line voltage VBL. The folding circuit 340 may be realized to include a fifth P-MOS transistor PM35 and a second N-MOS transistor NM32 which are coupled in series between the bit line BL and the ground voltage terminal. A bias voltage Vbias may be inputted to a gate of the fifth P-MOS transistor PM35. A source and a drain of the fifth P-MOS transistor PM35 may be coupled to the bit line BL and a third node node_E, respectively. The third node node_E may be coupled to the sensing input line 302. The sensing amplification enablement signal SAEN may be inputted to a gate of the second N-MOS transistor NM32. A drain and a source of the second N-MOS transistor NM32 may be coupled to the third node node_E and the ground voltage terminal, respectively.

A transconductance (Gm) of the fifth P-MOS transistor PM35 may be greater than a transconductance of the second N-MOS transistor NM32. For example, a channel length of the fifth P-MOS transistor PM35 may be less than a channel length of the second N-MOS transistor NM32, or a channel width of the fifth P-MOS transistor PM35 may be greater than a channel width of the second N-MOS transistor NM32. This means that an equivalent resistance value of the fifth P-MOS transistor PM35 is less than that of the second N-MOS transistor NM32 if both of the fifth P-MOS transistor PM35 and the second N-MOS transistor NM32 are turned on. Thus, if both of the fifth P-MOS transistor PM35 and the second N-MOS transistor NM32 are turned on, the sensing input signal SA_IN outputted from the third node node_E may have a voltage which is close to the bit line voltage VBL rather than the ground voltage.

The bias voltage Vbias applied to the gate of the fifth P-MOS transistor PM35 may have a voltage for turning off the fifth P-MOS transistor PM35 if the first P-MOS transistor PM31 has a programmed status and for turning on the fifth P-MOS transistor PM35 if the first P-MOS transistor PM31 has an initial status. In some embodiments, the bias voltage Vbias may be higher than a voltage that remains after subtracting an absolute value of a threshold voltage Vth of the fifth P-MOS transistor PM35 from a first bit line voltage induced at the bit line BL when the first P-MOS transistor PM31 has a programmed status. In addition, the bias voltage Vbias may be equal to or lower than a voltage that remains after subtracting an absolute value of a threshold voltage Vth of the fifth P-MOS transistor PM35 from a second bit line voltage induced at the bit line BL when the first P-MOS transistor PM31 has an initial status. The bias voltage Vbias may be expressed by the following equation 1.

$$VBL(\text{program}) - |Vth| < Vbias \leq VBL(\text{initial}) - |Vth| \quad \text{(Equation 1)}$$

where, "VBL(program)" denotes the first bit line voltage induced at the bit line BL when the first P-MOS transistor PM31 has a programmed status, "VBL(initial)" denotes the second bit line voltage induced at the bit line BL when the first P-MOS transistor PM31 has an initial status, and "|Vth|" denotes an absolute value of the threshold voltage of the fifth P-MOS transistor PM35.

Figure 4:
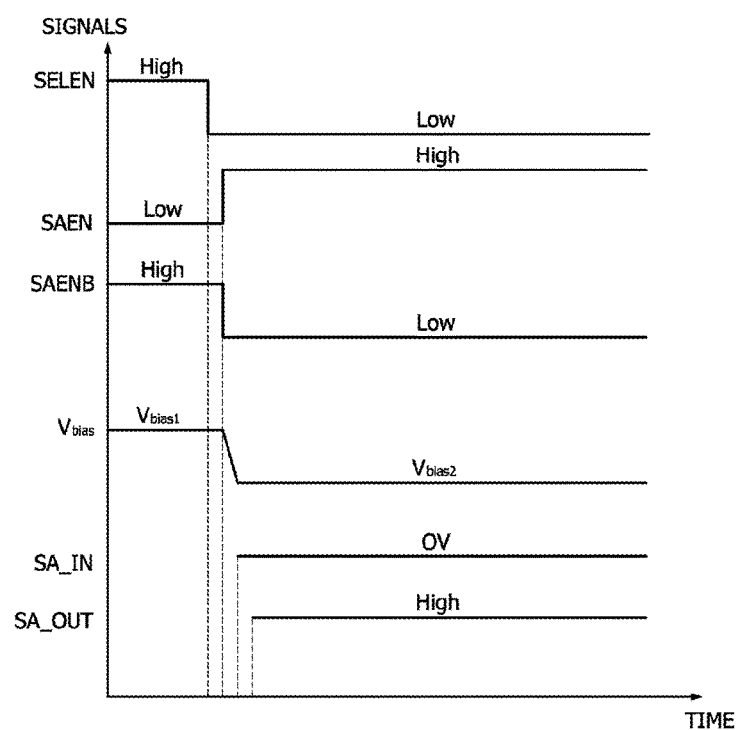
FIG. 4 is a timing diagram of various signals illustrating a read operation of a programmed cell transistor included in the nonvolatile memory device illustrated in FIG. 3.
Figure 5:
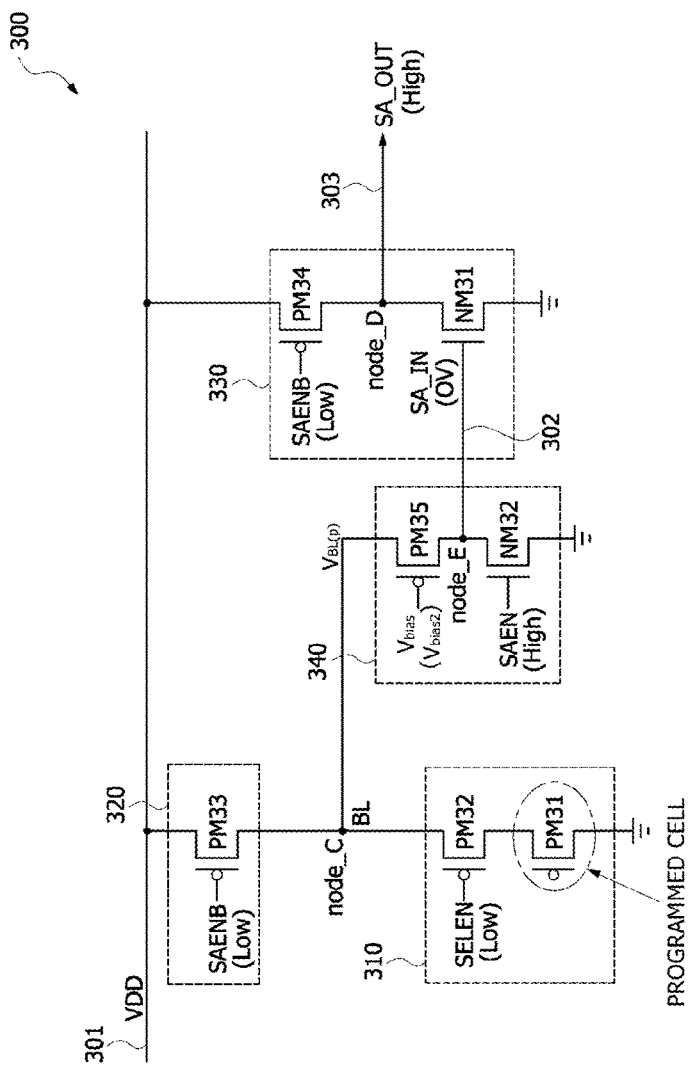
FIG. 5 is a circuit diagram illustrating a read operation of a programmed cell transistor included in the nonvolatile memory device illustrated in FIG. 3.

FIG. 4 is a timing diagram of various signals illustrating a read operation of a programmed cell transistor included in the nonvolatile memory device 300 illustrated in FIG. 3, and FIG. 5 is a circuit diagram illustrating the read operation of the programmed cell transistor included in the nonvolatile memory device 300 illustrated in FIG. 3. Referring to FIG. 5, the same reference numerals or designators as used in FIG. 3 denote the same elements. Referring to FIGS. 4 and 5, in order to read out the status of the first P-MOS transistor PM31, a level of the selection enablement signal SELEN applied to the gate of the second P-MOS transistor PM32 may be changed from a high level into a low level and a level of the sense amplification enablement signal SAEN applied to the gate of the second N-MOS transistor NM32 may be changed from a low level into a high level. A point of time that a level of the selection enablement signal SELEN is changed from a high level into a low level may precede a point of time that a level of the sense amplification enablement signal SAEN is changed from a low level into a high level. Alternatively, a point of time that a level of the selection enablement signal SELEN is changed from a high level into a low level may be the same as a point of time that a level of the sense amplification enablement signal SAEN is changed from a low level into a high level. If the sense amplification enablement signal SAEN has a high level, the enablement signal SAENB may have a low level. The bias voltage Vbias may keep a first bias voltage Vbias1 as an initial voltage and may have a second bias voltage Vbias2 if the sense amplification enablement signal SAEN has a high level. The second bias voltage Vbias2 may correspond to the bias voltage Vbias that meets the condition of the equation 1.

As both of the selection enablement signal SELEN and the enablement signal SAENB have a low level, all of the second P-MOS transistor PM32, the third P-MOS transistor PM33 and the fourth P-MOS transistor PM34 may be turned on. In addition, as the sense amplification enablement signal SAEN has a high level, the second N-MOS transistor NM32 may also be turned on. If the first P-MOS transistor PM31 has a programmed status corresponding to an on-cell status, a voltage of the first node node_C, that is, a first bit line voltage VBL(p) induced at the bit line BL may be close to the ground voltage rather than the supply voltage VDD. In such a case, the first bit line voltage VBL(p) may be determined by voltage division of the supply voltage VDD according to a ratio of a first equivalent resistance value of the third P-MOS transistor PM33 to a second equivalent resistance value corresponding to a total equivalent resistance value of the first and second P-MOS transistors PM31 and PM32. In some embodiments, for example but not limited to, if the supply voltage VDD is +5 volts, the first bit line voltage VBL(p) may be +2 volts. The first bit line voltage VBL(p) may be applied to the source of the fifth P-MOS transistor PM35.

As described with reference to the equation 1, the second bias voltage Vbias2 may be higher than a voltage that remains after subtracting an absolute value of a threshold voltage Vth of the fifth P-MOS transistor PM35 from the first bit line voltage VBL(p). If the first bit line voltage VBL(p) is +2 volts and the threshold voltage Vth of the fifth P-MOS transistor PM35 is −0.7 volts, the second bias voltage Vbias2 may be higher than +1.3 volts. For example, if the second bias voltage Vbias2 is +2 volts, the fifth P-MOS transistor PM35 may be turned off. Thus, the ground voltage may be induced at the third node node_E. Accordingly, the sensing input signal SA_IN inputted to the sensing circuit 330 may have the ground voltage (i.e., zero volts).

The sensing input signal SA_IN having the ground voltage may be applied to the gate of the first N-MOS transistor NM31. Thus, the first N-MOS transistor NM31 may be turned off. As the fourth P-MOS transistor PM34 is turned on and the first N-MOS transistor NM31 is turned off, the sensing output signal SA_OUT outputted from the sensing circuit 330 may have a high level. Accordingly, the first P-MOS transistor PM31 acting as a cell transistor of the NVM cell 310 may be regarded as a programmed cell by sensing a high level of the sensing output signal SA_OUT.

In the read operation described above, the sensing input signal SA_IN inputted to the sensing circuit 330 may have the ground voltage regardless of characteristics of the second N-MOS transistor NM32 as well as characteristics of the fourth P-MOS transistor PM34 and the first N-MOS transistor NM31 constituting the sensing circuit 330. That is, even though the characteristics of the second N-MOS transistor NM32 as well as the characteristics of the fourth P-MOS transistor PM34 and the first N-MOS transistor NM31 constituting the sensing circuit 330 change according to variation of a temperature and/or fabrication processes, the read operation of the first P-MOS transistor PM31 having a programmed status may not be affected by fluctuation of the characteristics of the second N-MOS transistor NM32, the fourth P-MOS transistor PM34 and the first N-MOS transistor NM31.

Figure 6:
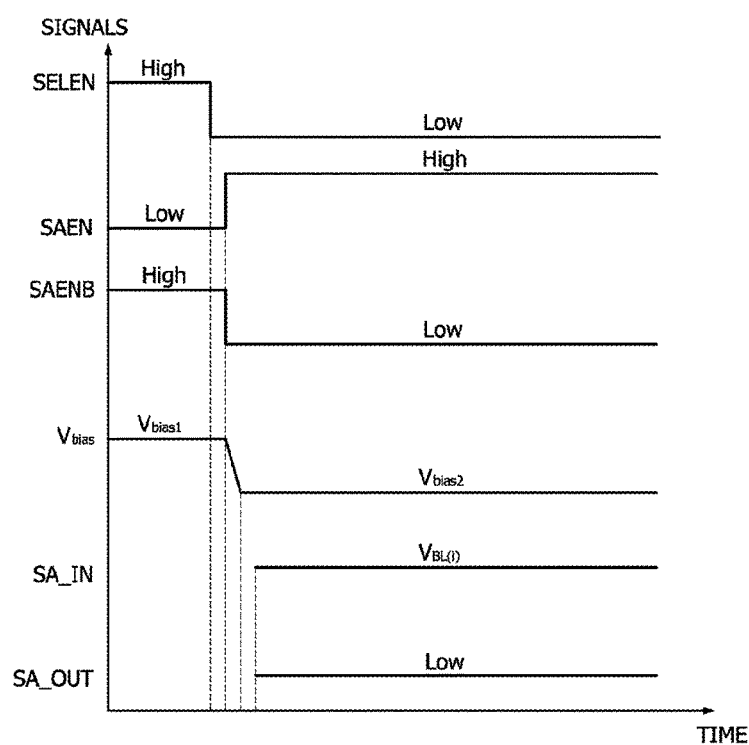
FIG. 6 is a timing diagram of various signals illustrating a read operation of an initial cell transistor included in the nonvolatile memory device illustrated in FIG. 3.
Figure 7:
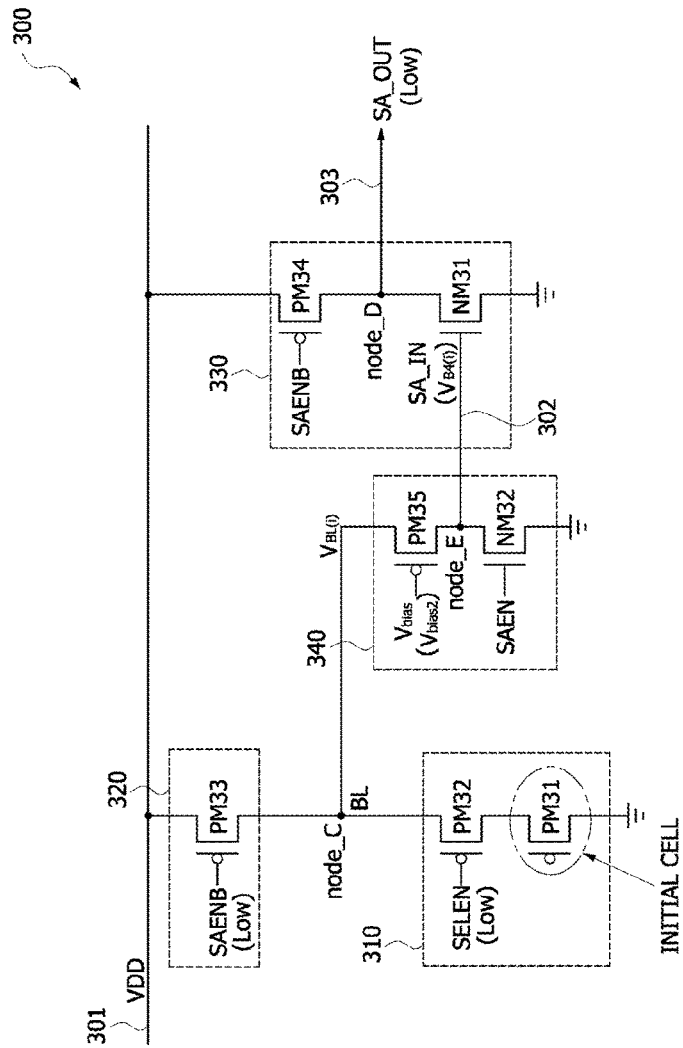
FIG. 7 is a circuit diagram illustrating a read operation of an initial cell transistor included in the nonvolatile memory device illustrated in FIG. 3.

FIG. 6 is a timing diagram of various signals illustrating a read operation of an initial cell transistor included in the nonvolatile memory device 300 illustrated in FIG. 3, and FIG. 7 is a circuit diagram illustrating the read operation of the initial cell transistor included in the nonvolatile memory device 300 illustrate in FIG. 3. Referring to FIG. 7, the same reference numerals or designators as used in FIG. 3 denote the same elements. Referring to FIGS. 6 and 7, in order to read out the status of the first P-MOS transistor PM31, a level of the selection enablement signal SELEN applied to the gate of the second P-MOS transistor PM32 may be changed from a high level into a low level and a level of the sense amplification enablement signal SAEN applied to the gate of the second N-MOS transistor NM32 may be changed from a low level into a high level. A point of time that a level of the selection enablement signal SELEN is changed from a high level into a low level may precede a point of time that a level of the sense amplification enablement signal SAEN is changed from a low level into a high level. Alternatively, a point of time that a level of the selection enablement signal SELEN is changed from a high level into a low level may be the same as a point of time that a level of the sense amplification enablement signal SAEN is changed from a low level into a high level. If the sense amplification enablement signal SAEN has a high level, the enablement signal SAENB may have a low level. The bias voltage Vbias may keep a first bias voltage Vbias1 as an initial voltage and may have a second bias voltage Vbias2 if the sense amplification enablement signal SAEN has a high level. The second bias voltage Vbias2 may correspond to the bias voltage Vbias that meets the condition of the equation 1.

As both of the selection enablement signal SELEN and the enablement signal SAENB have a low level, all of the second P-MOS transistor PM32, the third P-MOS transistor PM33 and the fourth P-MOS transistor PM34 may be turned on. In addition, as the sense amplification enablement signal SAEN has a high level, the second N-MOS transistor NM32 may also be turned on. If the first P-MOS transistor PM31 has an initial status corresponding to an off-cell status, a voltage of the first node node_C, that is, a second bit line voltage VBL(i) induced at the bit line BL may be close to the supply voltage VDD rather than the ground voltage. In such a case, the second bit line voltage VBL(i) may be determined by voltage division of the supply voltage VDD according to a ratio of the first equivalent resistance value of the third P-MOS transistor PM33 to the second equivalent resistance value corresponding to a total equivalent resistance value of the first and second P-MOS transistors PM31 and PM32. In some embodiments, for example but not limited to, if the supply voltage VDD is +5 volts, the second bit line voltage VBL(i) may be +3.5 volts. The second bit line voltage VBL(i) may be applied to the source of the fifth P-MOS transistor PM35.

As described with reference to the equation 1, the second bias voltage Vbias2 may be equal to or lower than a voltage that remains after subtracting an absolute value of a threshold voltage Vth of the fifth P-MOS transistor PM35 from the second bit line voltage VBL(i). If the second bit line voltage VBL(i) is +3.5 volts and the threshold voltage Vth of the fifth P-MOS transistor PM35 is −0.7 volts, the second bias voltage Vbias2 may be equal to or lower than +2.8 volts. For example, if the second bias voltage Vbias2 is +2 volts which is equal to the second bias voltage Vbias2 when the read operation of the first P-MOS transistor PM31 having a programmed status is executed, the fifth P-MOS transistor PM35 may be turned on. Thus, the third node node_E may have a voltage close to the second bit line voltage VBL(i), for example, +3.4 volts because an equivalent resistance value of the fifth P-MOS transistor PM35 is less than an equivalent resistance value of the second N-MOS transistor NM32. Accordingly, the sensing input signal SA_IN inputted to the sensing circuit 330 may have the voltage of the third node node_E, that is, +3.4 volts.

The sensing input signal SA_IN having the voltage of +3.4 volts may be applied to the gate of the first N-MOS transistor NM31. Thus, the first N-MOS transistor NM31 may be turned on. Although both of the fourth P-MOS transistor PM34 and the first N-MOS transistor NM31 are turned on, the sensing output signal SA_OUT outputted from the sensing circuit 330 may have a low level because an equivalent resistance value of the first N-MOS transistor NM31 is less than an equivalent resistance value of the fourth P-MOS transistor PM34. Accordingly, the first P-MOS transistor PM31 acting as a cell transistor of the NVM cell 310 may be regarded as an initial cell by sensing a low level of the sensing output signal SA_OUT.

In the read operation of the first P-MOS transistor PM31 having an initial status, the sensing input signal SA_IN inputted to the sensing circuit 330 may have a voltage close to the second bit line voltage VBL(i) regardless of characteristics of the second N-MOS transistor NM32 as well as characteristics of the fourth P-MOS transistor PM34 and the first N-MOS transistor NM31 constituting the sensing circuit 330. That is, even though the characteristics of the second N-MOS transistor NM32 as well as the characteristics of the fourth P-MOS transistor PM34 and the first N-MOS transistor NM31 constituting the sensing circuit 330 change according to variation of a temperature and/or fabrication processes, the read operation of the first P-MOS transistor PM31 having an initial status may not be affected by fluctuation of the characteristics of the second N-MOS transistor NM32, the fourth P-MOS transistor PM34 and the first N-MOS transistor NM31. Furthermore, since an equivalent resistance value of the fifth P-MOS transistor PM35 is relatively very low, a current flowing through the third P-MOS transistor PM33 may be almost bypassed toward the folding circuit 340 rather than the NVM cell 310. Thus, a stress applied to the first P-MOS transistor PM31 acting as a cell transistor due to the second bit line voltage VBL(i) may be relieved or alleviated.

Figure 8:
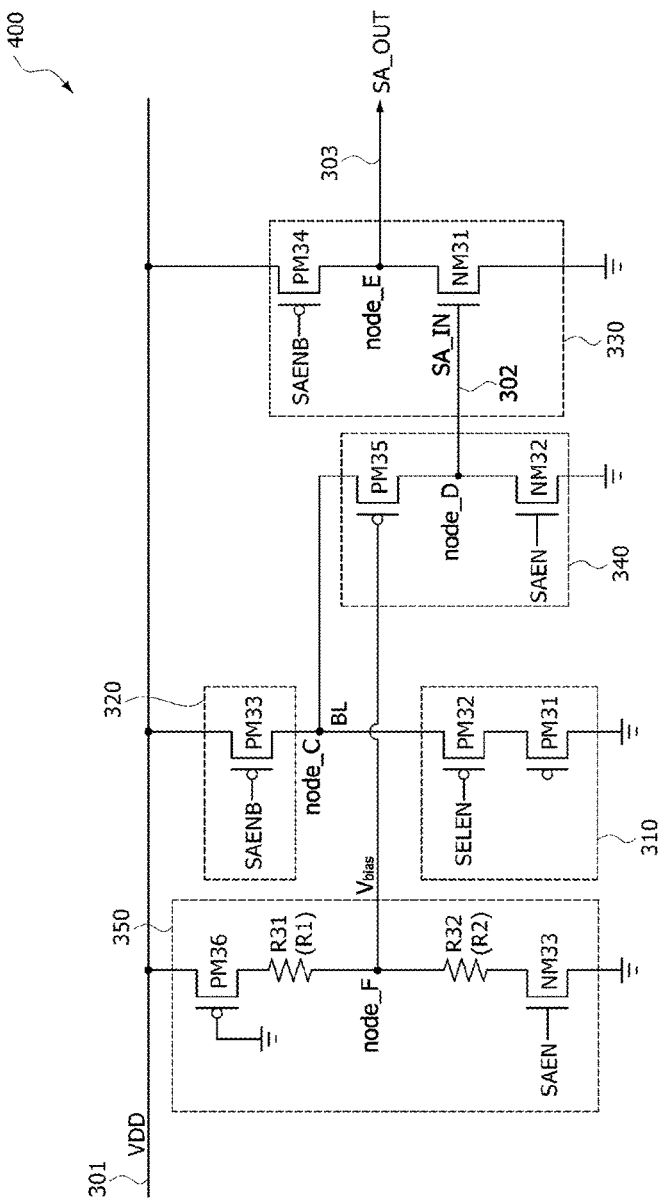
FIG. 8 is a circuit diagram illustrating a representation of an example of a nonvolatile memory device according to an embodiment of the present disclosure.

FIG. 8 is a circuit diagram illustrating an NVM device 400 according to an embodiment. Referring to FIG. 8, the same reference numerals or designators as used in FIG. 3 denote the same elements. Thus, to avoid duplicate explanation, descriptions of the same elements as illustrated in FIG. 3 will be omitted or briefly mentioned in these embodiments related to FIG. 8. Referring to FIG. 8, the NVM device 400 may be configured to further include a bias voltage generator 350 in addition to the NVM cell 310, the resistive load portion 320, the sensing circuit 330 and the folding circuit 340 described with reference to FIG. 3. The bias voltage generator 350 may be coupled between the supply voltage line 301 and the ground voltage terminal to output the bias voltage Vbias applied to the gate of the fifth P-MOS transistor PM35 of the folding circuit 340. The bias voltage generator 350 may be configured to include a sixth P-MOS transistor PM36 and a first resistor R31 coupled in series between the supply voltage line 301 and a fourth node node_F as well as a second resistor R32 and a third N-MOS transistor NM33 coupled in series between the fourth node node_F and the ground voltage terminal. The fourth node node_F may be coupled to the gate of the fifth P-MOS transistor PM35 through an output line of the bias voltage generator 350.

A gate of the sixth P-MOS transistor PM36 may be coupled to the ground voltage terminal. A source and a drain of the sixth P-MOS transistor PM36 may be coupled to the supply voltage line 301 and one terminal of the first resistor R31. Thus, the sixth P-MOS transistor PM36 may be turned on regardless of the read operation. The other terminal of the first resistor R31 may be coupled to the fourth node node_F. A first equivalent resistor having a first equivalent resistance value may be construed as being coupled between the supply voltage line 301 and the fourth node node_F. The first equivalent resistance value may correspond to a sum of an equivalent resistance value of the sixth P-MOS transistor PM36 and a resistance value (i.e., a first resistance value R1) of the first resistor R31. The sense amplification enablement signal SAEN may be applied to a gate of the third N-MOS transistor NM33. A drain and a source of the third N-MOS transistor NM33 may be coupled to one terminal of the second resistor R32 and the ground voltage terminal, respectively. Thus, if the sense amplification enablement signal SAEN has a high level, the third N-MOS transistor NM33 may be turned on. That is, the third N-MOS transistor NM33 may be turned on only during the read operation. The other terminal of the second resistor R32 may be coupled to the fourth node node_F. A second equivalent resistor having a second equivalent resistance value may be construed as being coupled between the fourth node node_F and the ground voltage terminal. The second equivalent resistance value may correspond to a sum of a resistance value (i.e., a second resistance value R2) of the second resistor R32 and an equivalent resistance value of the third N-MOS transistor NM33 turned on. The bias voltage Vbias generated from the bias voltage generator 350 may be determined by voltage division of the supply voltage VDD according to a ratio of the first equivalent resistance value to the second equivalent resistance value. The bias voltage Vbias may be within the range defined by the equation 1.

Figure 9:
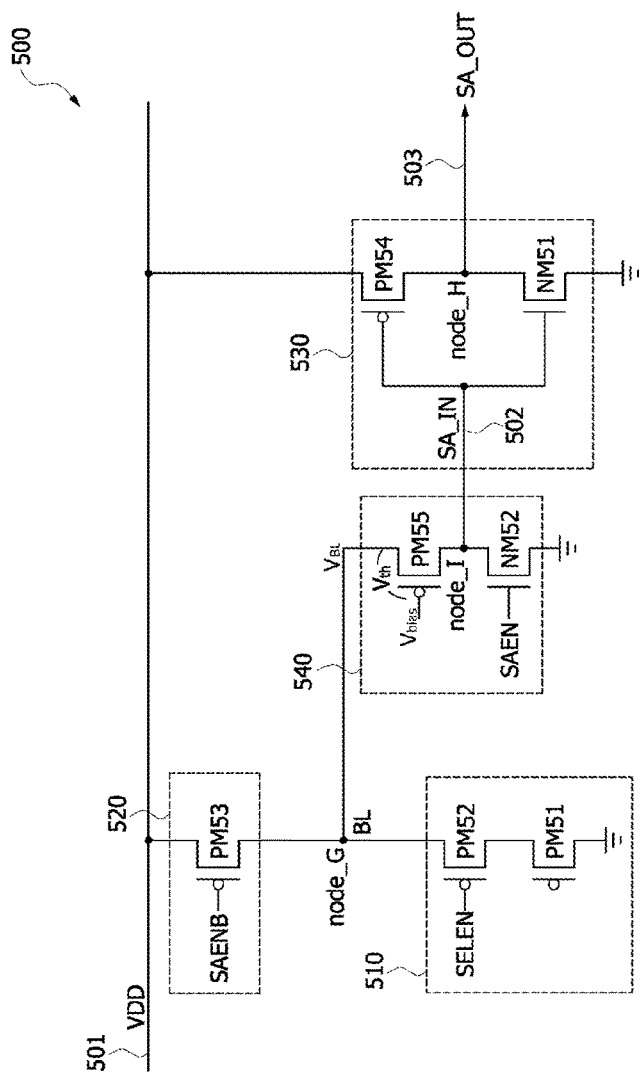
FIG. 9 is a circuit diagram illustrating a representation of an example of a nonvolatile memory device according to an embodiment of the present disclosure.

FIG. 9 is a circuit diagram illustrating an NVM device 500 according to an embodiment. Referring to FIG. 9, the NVM device 500 may be configured to include an NVM cell 510, a resistive load portion 520, a sensing circuit 530 and a folding circuit 540. The NVM cell 510 may be configured to include a selection transistor and a cell transistor which are coupled in series between a bit line BL and a ground voltage terminal. The cell transistor may be realized using a first P-MOS transistor PM51, and the selection transistor may be realized using a second P-MOS transistor PM52. The first P-MOS transistor PM51 may have a gate corresponding to a floating gate. A source and a drain of the first P-MOS transistor PM51 may be coupled to a drain of the second P-MOS transistor PM52 and the ground voltage terminal, respectively. The second P-MOS transistor PM52 may have a gate to which a selection enablement signal SELEN is inputted. A source of the second P-MOS transistor PM52 may be coupled to a first node node_G through a bit line BL. The first P-MOS transistor PM51 acting as a cell transistor may have an initial status or a programmed status. In some embodiments, the initial status means an off-cell status that the first P-MOS transistor PM51 is turned off, and the programmed status means an on-cell status that the first P-MOS transistor PM51 is turned on.

The resistive load portion 520 may be coupled between a supply voltage line 501 transmitting a supply voltage VDD and the first node node_G. The resistive load portion 520 may be realized using a third P-MOS transistor PM53. The third P-MOS transistor PM53 may have a gate to which an enablement signal SAENB is inputted. In some embodiments, the enablement signal SAENB may be an inverted (complementary) signal of a sense amplification enablement signal SAEN. A source and a drain of the third P-MOS transistor PM53 may be coupled to the supply voltage line 501 and the first node node_G, respectively. If the third P-MOS transistor PM53 is turned on, the third P-MOS transistor PM53 may act as a resistive load coupled between the supply voltage line 501 and the first node node_G.

The sensing circuit 530 may output a sensing output signal SA_OUT for sensing a status of the first P-MOS transistor PM51 through a sensing output line 503 in response to a sensing input signal SA_IN which is inputted thereto through a sensing input line 502. The sensing circuit 530 may be realized using a complementary metal-oxide-semiconductor (CMOS) inverter comprised of a fourth P-MOS transistor PM54 and a first N-MOS transistor NM51 which are coupled in series between the supply voltage line 501 and the ground voltage terminal.

A gate of the fourth P-MOS transistor PM54 may be coupled to the sensing input line 502 that transmits the sensing input signal SA_IN. A source and a drain of the fourth P-MOS transistor PM54 may be coupled to the supply voltage line 501 and a second node node_H, respectively. The second node node_H may be coupled to the sensing output line 503. A gate of the first N-MOS transistor NM51 may also be coupled to the sensing input line 502. Thus, the sensing input signal SA_IN may be applied to both of the gates of the first N-MOS transistor NM51 and the fourth P-MOS transistor PM54 through the sensing input line 502. A source and a drain of the first N-MOS transistor NM51 may be coupled to the second node node_H and the ground terminal, respectively.

The folding circuit 540 may be coupled between the bit line BL and the ground voltage terminal to output a voltage close to the ground voltage or a bit line voltage VBL as the sensing input signal SA_IN through the sensing input line 502, according to the bit line voltage VBL. The folding circuit 540 may be realized to include a fifth P-MOS transistor PM55 and a second N-MOS transistor NM52 which are coupled in series between the bit line BL and the ground voltage terminal. A bias voltage Vbias may be inputted to a gate of the fifth P-MOS transistor PM55. A source and a drain of the fifth P-MOS transistor PM55 may be coupled to the bit line BL and a third node node_I, respectively. The third node node_I may be coupled to the sensing input line 502. The sensing amplification enablement signal SAEN may be inputted to a gate of the second N-MOS transistor NM52. A drain and a source of the second N-MOS transistor NM52 may be coupled to the third node node_I and the ground voltage terminal, respectively.

A transconductance (Gm) of the fifth P-MOS transistor PM55 may be greater than a transconductance of the second N-MOS transistor NM52. For example, a channel length of the fifth P-MOS transistor PM55 may be less than a channel length of the second N-MOS transistor NM52, or a channel width of the fifth P-MOS transistor PM55 may be greater than a channel width of the second N-MOS transistor NM52. This means that an equivalent resistance value of the fifth P-MOS transistor PM55 is less than that of the second N-MOS transistor NM52 if both of the fifth P-MOS transistor PM55 and the second N-MOS transistor NM52 are turned on. Thus, if both of the fifth P-MOS transistor PM55 and the second N-MOS transistor NM52 are turned on, the sensing input signal SA_IN outputted from the third node node_I may have a voltage which is close to the bit line voltage VBL rather than the ground voltage.

The bias voltage Vbias applied to the gate of the fifth P-MOS transistor PM55 may have a voltage for turning off the fifth P-MOS transistor PM55 if the first P-MOS transistor PM51 has a programmed status and for turning on the fifth P-MOS transistor PM55 if the first P-MOS transistor PM51 has an initial status. In some embodiments, the bias voltage Vbias may be higher than a voltage that remains after subtracting an absolute value of a threshold voltage Vth of the fifth P-MOS transistor PM55 from a first bit line voltage induced at the bit line BL when the first P-MOS transistor PM51 has a programmed status. In addition, the bias voltage Vbias may be equal to or lower than a voltage that remains after subtracting an absolute value of a threshold voltage Vth of the fifth P-MOS transistor PM55 from a second bit line voltage induced at the bit line BL when the first P-MOS transistor PM51 has an initial status. That is, the NVM device 500 may further include the bias voltage generator 350 described with reference to FIG. 8. In such a case, the fourth node node_F of the bias voltage generator 350 may be coupled to the gate of the fifth P-MOS transistor PM55.

Figure 10:
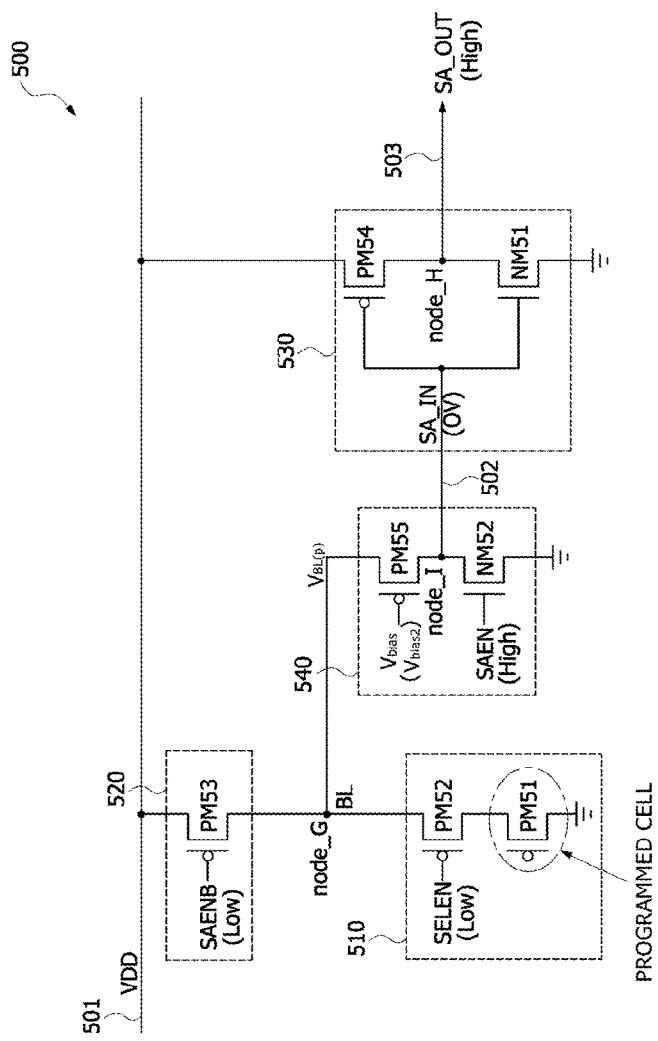
FIG. 10 is a circuit diagram illustrating a read operation of a programmed cell transistor included in the nonvolatile memory device illustrated in FIG. 9.

FIG. 10 is a circuit diagram illustrating a read operation of a programmed cell transistor included in the NVM device 500 illustrated in FIG. 9. Referring to FIG. 10, the same reference numerals or designators as used in FIG. 9 denote the same elements. Referring to FIG. 10, in order to read out the status of the first P-MOS transistor PM51, the selection enablement signal SELEN may be set to have a low level and the sense amplification enablement signal SAEN may be set to have a high level. Since the sense amplification enablement signal SAEN is set to have a high level, the enablement signal SAENB may have a low level. As the sense amplification enablement signal SAEN has a high level, the bias voltage Vbias may have a second bias voltage Vbias2. The second bias voltage Vbias2 may correspond to the bias voltage Vbias that meets the condition of the equation 1.

As both of the selection enablement signal SELEN and the enablement signal SAENB have a low level, both of the second P-MOS transistor PM52 and the third P-MOS transistor PM53 may be turned on. In addition, as the sense amplification enablement signal SAEN has a high level, the second N-MOS transistor NM52 may also be turned on. If the first P-MOS transistor PM51 has a programmed status corresponding to an on-cell status, a voltage of the first node node_G, that is, a first bit line voltage VBL(p) induced at the bit line BL may be close to the ground voltage rather than the supply voltage VDD. In such a case, the first bit line voltage VBL(p) may be determined by voltage division of the supply voltage VDD according to a ratio of a first equivalent resistance value of the third P-MOS transistor PM53 to a second equivalent resistance value corresponding to a total equivalent resistance value of the first and second P-MOS transistors PM51 and PM52. In some embodiments, for example but not limited to, if the supply voltage VDD is +5 volts, the first bit line voltage VBL(p) may be +2 volts. The first bit line voltage VBL(p) may be applied to the source of the fifth P-MOS transistor PM55.

As described with reference to the equation 1, the second bias voltage Vbias2 may be higher than a voltage that remains after subtracting an absolute value of a threshold voltage Vth of the fifth P-MOS transistor PM55 from the first bit line voltage VBL(p). If the first bit line voltage VBL(p) is +2 volts and the threshold voltage Vth of the fifth P-MOS transistor PM55 is −0.7 volts, the second bias voltage Vbias2 may be higher than +1.3 volts. For example, if the second bias voltage Vbias2 is +2 volts, the fifth P-MOS transistor PM55 may be turned off. Thus, the ground voltage may be induced at the third node node_I. Accordingly, the sensing input signal SA_IN inputted to the sensing circuit 530 may have the ground voltage (i.e., zero volts).

The sensing input signal SA_IN having the ground voltage may be applied to both of the gate of the first N-MOS transistor NM51 and the gate of the fourth P-MOS transistor PM54. Thus, the first N-MOS transistor NM51 may be turned off while the fourth P-MOS transistor PM54 is turned on. Since the fourth P-MOS transistor PM54 is turned on and the first N-MOS transistor NM51 is turned off, the sensing output signal SA_OUT outputted from the sensing circuit 530 may have a high level. Accordingly, the first P-MOS transistor PM51 acting as a cell transistor of the NVM cell 510 may be regarded as a programmed cell by sensing a high level of the sensing output signal SA_OUT.

In the read operation of the first N-MOS transistor PM51 having a programmed status, the sensing input signal SA_IN inputted to the sensing circuit 530 may have the ground voltage regardless of characteristics of the second N-MOS transistor NM52 as well as characteristics of the fourth P-MOS transistor PM54 and the first N-MOS transistor NM51 constituting the sensing circuit 530. That is, even though the characteristics of the second N-MOS transistor NM52 as well as the characteristics of the fourth P-MOS transistor PM54 and the first N-MOS transistor NM51 constituting the sensing circuit 530 change according to variation of a temperature and/or fabrication processes, the read operation of the first P-MOS transistor PM51 having a programmed status may not be affected by fluctuation of the characteristics of the second N-MOS transistor NM52, the fourth P-MOS transistor PM54 and the first N-MOS transistor NM51.

Figure 11:
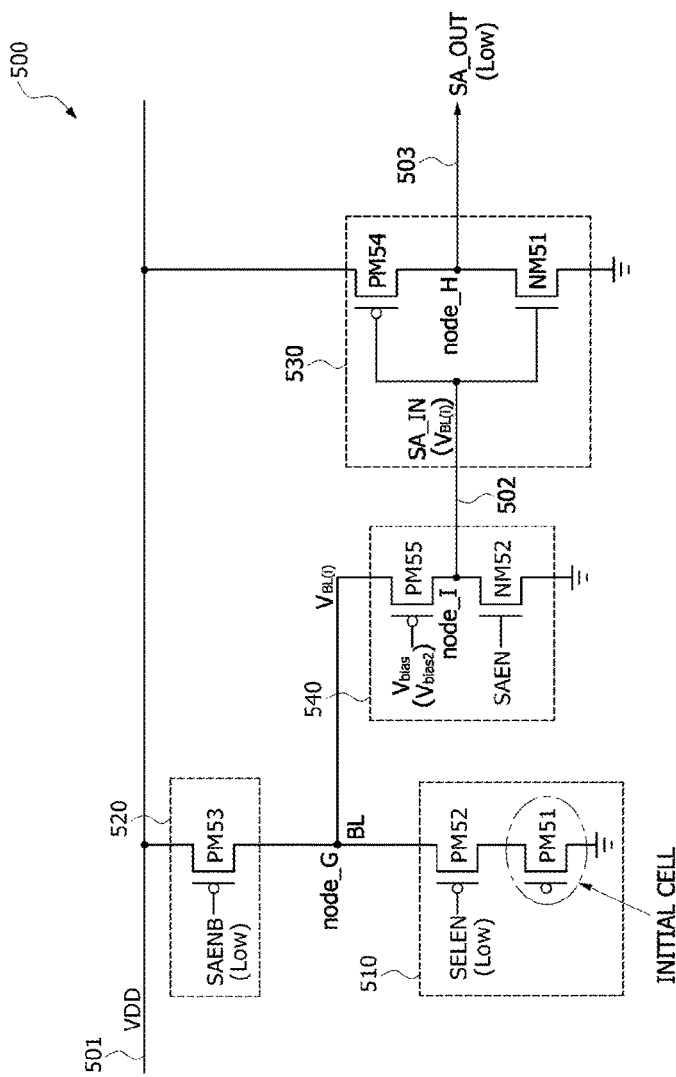
FIG. 11 is a circuit diagram illustrating a read operation of an initial cell transistor included in the nonvolatile memory device illustrated in FIG. 9.

FIG. 11 is a circuit diagram illustrating a read operation of an initial cell transistor included in the NVM device 500 illustrated in FIG. 9. Referring to FIG. 11, the same reference numerals or designators as used in FIG. 9 denote the same elements. Referring to FIG. 11, in order to read out the status of the first P-MOS transistor PM51, the selection enablement signal SELEN may be set to have a low level and the sense amplification enablement signal SAEN may be set to have a high level. Since the sense amplification enablement signal SAEN is set to have a high level, the enablement signal SAENB may have a low level. As the sense amplification enablement signal SAEN has a high level, the bias voltage Vbias may have a second bias voltage Vbias2. The second bias voltage Vbias2 may correspond to the bias voltage Vbias that meets the condition of the equation 1.

As both of the selection enablement signal SELEN and the enablement signal SAENB have a low level, both of the second P-MOS transistor PM52 and the third P-MOS transistor PM53 may be turned on. In addition, as the sense amplification enablement signal SAEN has a high level, the second N-MOS transistor NM52 may also be turned on. If the first P-MOS transistor PM51 has an initial status corresponding to an off-cell status, a voltage of the first node node_G, that is, a second bit line voltage VBL(i) induced at the bit line BL may be close to the supply voltage VDD rather than the ground voltage. In such a case, the second bit line voltage VBL(i) may be determined by voltage division of the supply voltage VDD according to a ratio of a first equivalent resistance value of the third P-MOS transistor PM53 to a second equivalent resistance value corresponding to a total equivalent resistance value of the first and second P-MOS transistors PM51 and PM52. In some embodiments, for example but not limited to, if the supply voltage VDD is +5 volts, the second bit line voltage VBL(i) may be +3.5 volts. The second bit line voltage VBL(i) may be applied to the source of the fifth P-MOS transistor PM55.

As described with reference to the equation 1, the second bias voltage Vbias2 may be equal to or lower than a voltage that remains after subtracting an absolute value of a threshold voltage Vth of the fifth P-MOS transistor PM55 from the second bit line voltage VBL(i). If the second bit line voltage VBL(i) is +3.5 volts and the threshold voltage Vth of the fifth P-MOS transistor PM55 is −0.7 volts, the second bias voltage Vbias2 may be equal to or lower than +2.8 volts. For example, if the second bias voltage Vbias2 is +2 volts which is equal to the second bias voltage Vbias2 when the read operation of the first P-MOS transistor PM51 having a programmed status is executed, the fifth P-MOS transistor PM55 may be turned on. Thus, the third node node_I may have a voltage close to the second bit line voltage VBL(i), for example, +3.4 volts because an equivalent resistance value of the fifth P-MOS transistor PM55 is less than an equivalent resistance value of the second N-MOS transistor NM52. Accordingly, the sensing input signal SA_IN inputted to the sensing circuit 530 may have the voltage of the third node node_I, that is, +3.4 volts.

The sensing input signal SA_IN having the voltage of +3.4 volts may be applied to both of the gate of the first N-MOS transistor NM51 and the gate of the fourth P-MOS transistor PM54. Thus, the first N-MOS transistor NM51 may be turned on while the fourth P-MOS transistor PM54 is turned off. Since the fourth P-MOS transistor PM54 is turned off and the first N-MOS transistor NM51 is turned on, the sensing output signal SA_OUT outputted from the sensing circuit 530 may have a low level. Accordingly, the first P-MOS transistor PM51 acting as a cell transistor of the NVM cell 510 may be regarded as an initial cell by sensing a low level of the sensing output signal SA_OUT.

In the read operation of the first N-MOS transistor PM51 having an initial status, the sensing input signal SA_IN inputted to the sensing circuit 530 may have the second bit line voltage VBL(i) regardless of characteristics of the second N-MOS transistor NM52 as well as characteristics of the fourth P-MOS transistor PM54 and the first N-MOS transistor NM51 constituting the sensing circuit 530. That is, even though the characteristics of the second N-MOS transistor NM52 as well as the characteristics of the fourth P-MOS transistor PM54 and the first N-MOS transistor NM51 constituting the sensing circuit 530 change according to variation of a temperature and/or fabrication processes, the read operation of the first P-MOS transistor PM51 having an initial status may not be affected by fluctuation of the characteristics of the second N-MOS transistor NM52, the fourth P-MOS transistor PM54 and the first N-MOS transistor NM51. Furthermore, since an equivalent resistance value of the fifth P-MOS transistor PM55 is relatively very low, a current flowing through the third P-MOS transistor PM53 may be almost bypassed toward the folding circuit 540 rather than the NVM cell 510. Thus, a stress applied to the first P-MOS transistor PM51 acting as a cell transistor due to the second bit line voltage VBL(i) may be relieved or alleviated.

According to the embodiments described above, an NVM device may employ a folding circuit that generates a sensing input signal which is inputted to a sensing circuit and is set to have a ground voltage or a bit line voltage according to a level of the bit line voltage. Thus, the NVM device may have a wide operation range during a read operation and may reduce a sensitivity to variation of characteristics of transistors included therein.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A nonvolatile memory device comprising:
   a nonvolatile memory cell coupled to a bit line;
   a sensing circuit configured to output a sensing output signal for sensing a status of the nonvolatile memory cell based on a sensing input signal inputted to the sensing circuit through a sensing input line; and
   a folding circuit coupled to the bit line to output the sensing input signal having a voltage low level or a voltage high level according to a voltage level of the bit line,
   wherein the sensing circuit is configured to include a P-MOS transistor and an N-MOS transistor coupled in series between the supply voltage line and a ground voltage,
   wherein the P-MOS transistor of the sensing circuit has a gate to which an enablement signal is inputted, a source coupled to the supply voltage line, and a drain coupled to the sensing output line; and
   wherein the N-MOS transistor of the sensing circuit has a gate coupled to the sensing input line, a drain coupled to the sensing output line, and a source coupled to the ground voltage.

2. The nonvolatile memory device of claim 1, wherein the voltage low level is a ground voltage level, and the voltage high level is substantially a voltage level of the bit line.

3. The nonvolatile memory device of claim 1, wherein the nonvolatile memory cell includes a first P-MOS transistor having a floating gate, a source coupled to the bit line, and a drain coupled to a ground voltage, and
   the nonvolatile memory cell further includes a selection transistor coupled between the bit line and the first P-MOS transistor, and
   wherein the selection transistor is configured to include a second P-MOS transistor having a source coupled to the bit line, a drain coupled to the source of the first P-MOS transistor, and a gate to which a selection enablement signal is inputted.

4. The nonvolatile memory device of claim 1, further comprising a resistive load portion coupled between the bit line and a supply voltage line,
   wherein the resistive load portion is configured to include a P-MOS transistor having a gate to which the enablement signal is inputted, a source coupled to the supply voltage line, and a drain coupled to the bit line.

5. The nonvolatile memory device of claim 1,
   wherein the folding circuit is configured to include a P-MOS transistor and an N-MOS transistor which are coupled in series between the bit line and the ground voltage,
   wherein the P-MOS transistor of the folding circuit has a gate to which a bias voltage is inputted, a source coupled to the bit line, and a drain coupled to the sensing input line; and
   wherein the N-MOS transistor of the folding circuit has a gate to which a sense amplification enablement signal is inputted, a drain coupled to the sensing input line, and a source coupled to the ground voltage.

6. The nonvolatile memory device of claim 5, wherein the enablement signal is an inverted signal of the sense amplification enablement signal.

7. The nonvolatile memory device of claim 5, wherein the bias voltage turns off the P-MOS transistor of the folding circuit if the nonvolatile memory cell has a programmed status and turns on the P-MOS transistor of the folding circuit if the nonvolatile memory cell has an initial status.

8. The nonvolatile memory device of claim 7,
   wherein the bias voltage is higher than a voltage that remains after subtracting an absolute value of a threshold voltage of the P-MOS transistor of the folding circuit from a first bit line voltage induced at the bit line when the nonvolatile memory cell has a programmed status; and
   wherein the bias voltage is equal to or lower than a voltage that remains after subtracting an absolute value of a threshold voltage of the P-MOS transistor of the folding circuit from a second bit line voltage induced at the bit line when the nonvolatile memory cell has an initial status.

9. The nonvolatile memory device of claim 7, further comprising a bias voltage generator coupled between the supply voltage line and the ground voltage to generate the bias voltage,
   wherein the bias voltage generator includes:
   a P-MOS transistor and a first resistor coupled in series between the supply voltage line and the gate of the P-MOS transistor of the folding circuit; and
   a second resistor and a N-MOS transistor coupled in series between the gate of the P-MOS transistor of the folding circuit and the ground voltage.

10. The nonvolatile memory device of claim 9,
    wherein a gate of the P-MOS transistor of the bias voltage generator is coupled to a ground voltage, and
    wherein a gate of the N-MOS transistor of the bias voltage generator is configured to receive the sensing amplification enablement signal.

11. A nonvolatile memory device comprising:
    a nonvolatile memory cell coupled to a bit line;
    a sensing circuit configured to output a sensing output signal for sensing a status of the nonvolatile memory cell based on a sensing input signal inputted to the sensing circuit through a sensing input line; and
    a folding circuit coupled to the nonvolatile memory cell through the bit line and coupled to the sensing circuit through the sensing input line, wherein the folding circuit prevents a read operation of the nonvolatile memory cell, having a programmed status, from being affected by fluctuation characteristics of transistors within the folding circuit and the sensing circuit, wherein the sensing circuit is configured to include a P-MOS transistor and an N-MOS transistor coupled in series between the supply voltage line and a ground voltage, wherein the P-MOS transistor of the sensing circuit has a gate to which an enablement signal is inputted, a source coupled to the supply voltage line, and a drain coupled to the sensing output line; and wherein the N-MOS transistor of the sensing circuit has a gate coupled to the sensing input line, a drain coupled to the sensing output line, and a source coupled to the ground voltage.

12. The nonvolatile memory device according to claim 11, wherein the folding circuit prevents the sensing output signal from being affected from a variance in a transconductance of the transistors within the sensing circuit.

13. The nonvolatile memory device according to claim 11, wherein the effects of the fluctuation characteristics of a first P-MOS transistor of the nonvolatile memory cell having a floating gate, a source coupled to the bit line, and a drain coupled to a ground voltage are prevented by the folding circuit to allow the read operation of the nonvolatile memory cell to be unaffected by the fluctuation characteristics.

14. The nonvolatile memory device according to claim 11, wherein the effects of the fluctuation characteristics of the P-MOS transistor and the N-MOS transistor of the sensing circuit are prevented by the folding circuit to allow the read operation of the nonvolatile memory cell to be unaffected by the fluctuation characteristics.

15. The nonvolatile memory device according to claim 11, wherein the folding circuit is configured to include a third P-MOS transistor and a second N-MOS transistor which are coupled in series between the bit line and a ground voltage, and wherein the effects of the fluctuation characteristics of the second N-MOS transistor is prevented by the folding circuit to allow the read operation of the nonvolatile memory cell to be unaffected by the fluctuation characteristics.

* * * * *